(12) United States Patent
Sim et al.

(10) Patent No.: US 7,723,190 B2
(45) Date of Patent: May 25, 2010

(54) METHOD OF MANUFACTURING A SEMICONDUCTOR DEVICE

(75) Inventors: Gyu Gwang Sim, Gunpo-si (KR); Jong Min Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 618 days.

(21) Appl. No.: 11/647,691

(22) Filed: Dec. 28, 2006

(65) Prior Publication Data
US 2007/0158726 A1  Jul. 12, 2007

(30) Foreign Application Priority Data
Dec. 29, 2005  (KR)  ............... 10-2005-0134457

(51) Int. Cl.
*H01L 21/8234* (2006.01)
(52) U.S. Cl. .............. 438/270; 257/E29.257; 257/E29.26
(58) Field of Classification Search ........... 438/270; 257/E29.257, E29.26
See application file for complete search history.

(56) References Cited

U.S. PATENT DOCUMENTS

| | | | |
|---|---|---|---|
| 5,981,996 A | 11/1999 | Fujishima | |
| 6,020,600 A * | 2/2000 | Miyajima et al. | 257/76 |
| 6,174,773 B1 | 1/2001 | Fujishima | |
| 6,307,246 B1 | 10/2001 | Nitta et al. | |
| 6,541,817 B1 | 4/2003 | Hurkx et al. | |
| 6,700,175 B1 | 3/2004 | Kodama et al. | |
| 7,393,749 B2 * | 7/2008 | Yilmaz et al. | 438/259 |

FOREIGN PATENT DOCUMENTS

| | | |
|---|---|---|
| EP | 1 211 734 A1 | 6/2002 |
| JP | 2001-111050 | 4/2001 |
| WO | WO 00/33386 | 6/2000 |

OTHER PUBLICATIONS

Hatsutori Yoshikuni and Suzuki Takashi; Vertical Semiconductor Device; Publication No. JP2001111050; Publication Date: Apr. 4, 2001; Abstract of JP2001111050; esp@cenet, http://v3.espacenet.com.
First Office Action; Application No. 200610170181.8; Dated: May 9, 2008; The State Intellectual Property Office of the People's Republic of China.

* cited by examiner

*Primary Examiner*—Jerome Jackson, Jr.
*Assistant Examiner*—Paul A Budd
(74) *Attorney, Agent, or Firm*—The Law Offices of Andrew D. Fortney; Andrew D. Fortney; Theresa J. Mahan

(57) ABSTRACT

Disclosed are a semiconductor device having a vertical trench gate structure to improve the integration degree and a method of manufacturing the same. The semiconductor device includes an epitaxial layer having a second conductive type on a first conductive type substrate having an active region and an isolation region, a trench in the isolation region, a first conductive type first region in the epitaxial layer at opposite side portions of the trench, an isolation layer at a predetermined depth in the trench, a gate insulation layer along upper side portions of the trench, a gate electrode in an upper portion of the trench, a body region in the active region, a source electrode on the body region, a source region in an upper portion of the body region at opposite side portions of the gate electrode, and a drain electrode at a rear surface of the substrate.

20 Claims, 12 Drawing Sheets

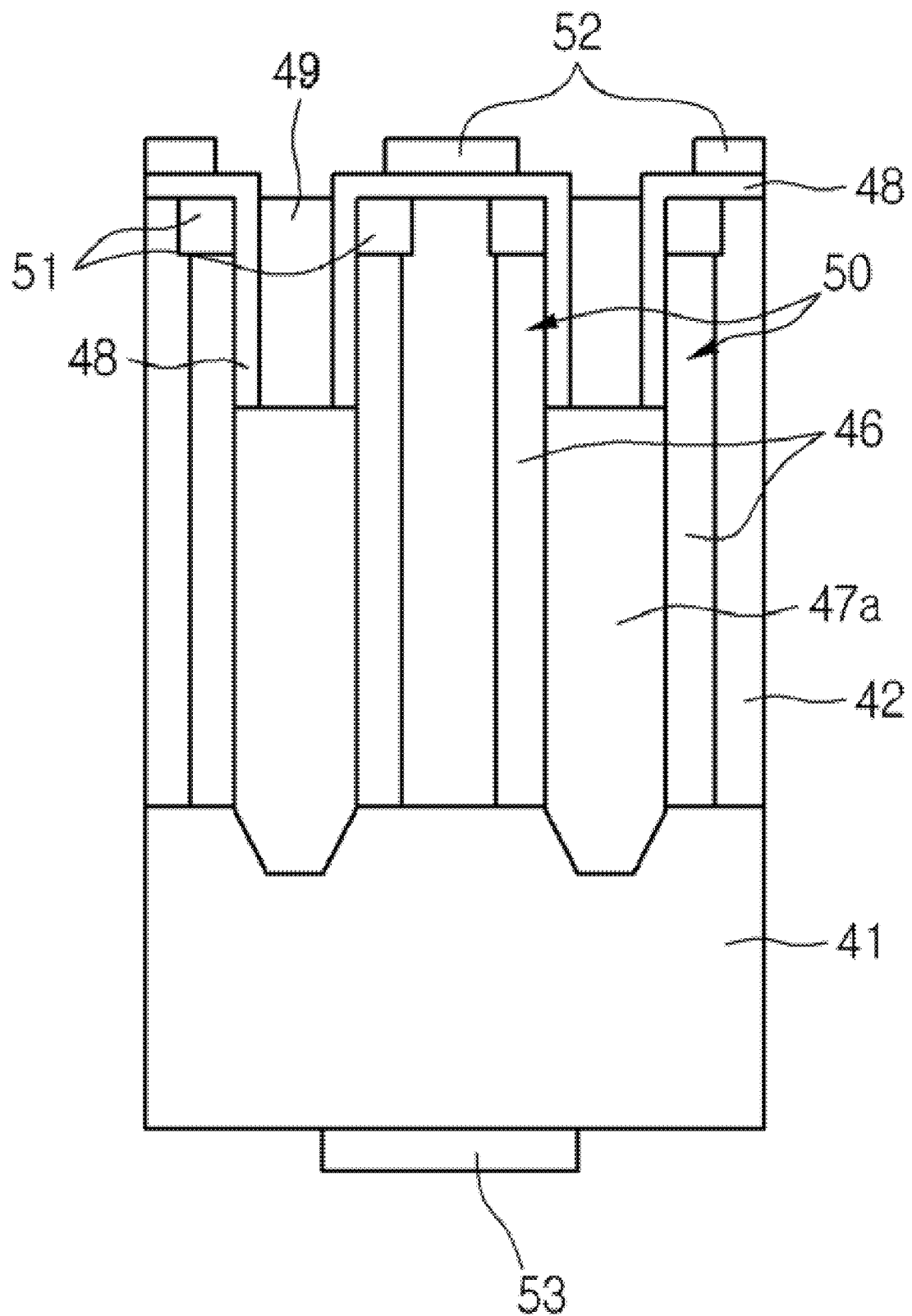

METHOD OF MANUFACTURING A SEMICONDUCTOR DEVICE

BACKGROUND OF THE INVENTION

1. Field of the Invention

The present invention relates to a semiconductor device, and more particularly to a semiconductor device and a method of manufacturing the same, capable of simplifying manufacturing processes and highly integrating devices while reducing ON resistance.

2. Description of the Related art

FIG. 1 is a cross-sectional view of the structure of a conventional semiconductor device and FIG. 2 is a cross-sectional view of the structure of another conventional semiconductor device.

The super-junction structure of a semiconductor device is obtained by substituting a drift region of a MOSFET device having a normal electric power with a vertical PN junction structure, and this structure uniformly distributes an electric field when the device is in an OFF state, thereby improving the breakdown voltage.

The super-junction structure of a conventional semiconductor device is illustrated in FIG. 1. As shown in FIG. 1, an N-type epitaxial layer 11 is grown on an N-type substrate 10 and a gate insulating layer 12 and a gate electrode 13 are integrated on a portion of the N-type epitaxial layer 11. On the substrate 10 isolated from the gate electrode 13, a source electrode 14 is formed. In addition, a first P-type doped region 15 extends from a bottom portion of the gate electrode 13 to a predetermined depth of the substrate 10. In addition, a second N-type doped region 16 is formed at both bottom portions of the gate electrode 13 and the source electrode 14 and at the surface portion of the first doping region 15 formed between the gate electrode 13 and the source electrode 14.

In this manner, a conventional vertical PN junction is achieved.

In addition, in a semiconductor device manufactured according to another conventional method as illustrated in FIG. 2, a trench is formed at both side portions of an active region, and N-type and P-type ions are implanted onto both side wall portions of the trench, thereby obtaining the vertical PN junction structure.

That is, a first N-type doping region 21 is formed in a substrate 20 and a gate insulation layer 24 and a gate electrode 25 are integrated on the substrate 20. And, a source electrode 26 is formed at one portion of the substrate 20 insulated from the gate electrode 25. First and second trenches 22a and 22b are formed under both side portions of the gate electrode 25 and the source electrode 26, and a trench isolation layer 23 is formed at each trench.

At one side region of each trench insulation layer 23, a second P-type ion implanted doping region 27 is formed. In addition, a third N-type doping region 28 is formed on the surface portion of the second P-type doped region 27 and between the source electrode 26 and the gate electrode 25.

As described above, a trench is formed at both side regions of the active region and a vertical PN junction region is formed between the trenches in FIG. 2.

However, in order to obtain the super-junction structure having a sufficient depth in the above-described conventional semiconductor device, the processes of growing an epitaxial layer and implanting ions must be repeated several times.

Moreover, since the semiconductor device has a horizontal gate structure, one channel is present at one active region, so that it is limited to increase the device density.

The present invention has been made to solve the above problems, and an object of the present invention to provide a semiconductor device having a vertical trench gate structure to improve the integration degree of the device and a method of manufacturing the same.

SUMMARY OF THE INVENTION

A semiconductor device according to an embodiment of the present invention comprises: a first conductive substrate; a second conductive epitaxial layer on the first conductive substrate and having a trench; a P-N junction aligned vertically along an inner wall of the trench; an insulation layer covering an inner portion and an outer wall of the trench; a gate electrode on the insulation layer; a body region at opposite sides of the gate electrode; a source electrode on an upper portion of the body region; and a drain electrode on a bottom surface of the first conductive substrate.

According to a preferred embodiment of the present invention, the PN junction is defined by the epitaxial layer and a second conductive layer on an inner wall of the trench in the epitaxial layer.

According to a preferred embodiment of the present invention, the insulation layer includes an isolation layer and a gate insulation layer, which together fill the trench to a predetermined height.

According to a preferred embodiment of the present invention, the first conductive type is a P-type and the second conductive type is an N-type.

According to a preferred embodiment of the present invention, the trench has a depth reaching the first conductive substrate.

According to another aspect of the present invention, there is provided a method of forming a semiconductor device, the method comprising the steps of: forming an epitaxial layer having a second conductivity type on a first conductive substrate; forming a trench in the epitaxial layer; forming a PN junction along an inner wall of the trench; forming an insulation layer in the trench; forming a gate electrode on the insulation layer; forming a source region at opposite sides of the gate electrode; and forming source and drain electrodes.

According to a preferred embodiment of the present invention, the step of forming the PN junction includes a step of forming a first conductive layer on an inner wall of the trench.

According to a preferred embodiment of the present invention, the step of forming the insulation layer in the trench includes the sub-steps of: forming an isolation layer such that the isolation layer fills the trench to a predetermined height; and forming a gate insulation layer on the isolation layer.

According to a preferred embodiment of the present invention, the step of forming the first conductive layer on the inner wall of the trench includes a step of implanting first conductive type ions.

According to a preferred embodiment of the present invention, the first conductive type is a P-type and the second conductive type is an N-type.

According to a preferred embodiment of the present invention, the step of forming the trench forms the trench such that it has a depth reaching the first conductive substrate.

A preferred embodiment of the present invention includes a step of forming a pad insulation layer on the epitaxial layer to protect a surface of the epitaxial layer.

According to a preferred embodiment of the present invention, the step of forming the insulation layer in the trench includes the sub-steps of: depositing the insulation layer such that trench fills the insulation layer; and etching the insulation layer such that an upper side portion of the trench is exposed.

BRIEF DESCRIPTION OF THE DRAWINGS

FIG. 3 is a cross-sectional view showing the structure of a semiconductor device according to a preferred embodiment of the present invention;

DETAILED DESCRIPTION OF THE INVENTION

Hereinafter, the preferred embodiments of the present invention will be described referring to attached drawings. The embodiments are illustrative purposes only and are not intended to limit the scope of the claims of the present invention.

FIG. 3 is a cross-sectional view showing the structure of the semiconductor device according to a preferred embodiment of the present invention, and FIGS. 4A to 4I are cross-sectional views showing the procedure for manufacturing a semiconductor device according to a preferred embodiment of the present invention.

Figure 5:
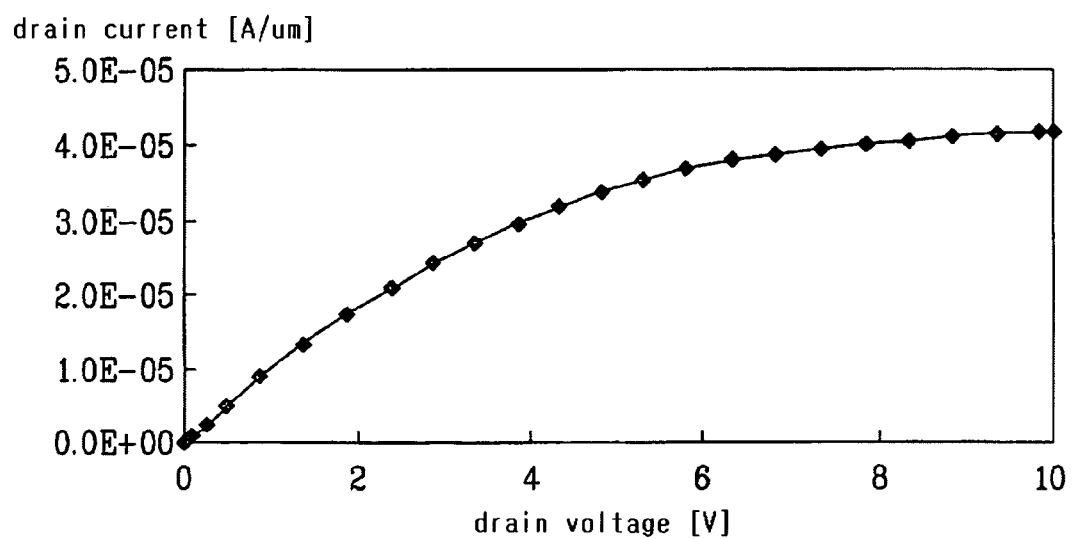
FIGS. 5 and 6 are data diagrams for illustrating a drain saturation current and breakdown characteristic according to a drain voltage.
Figure 6:
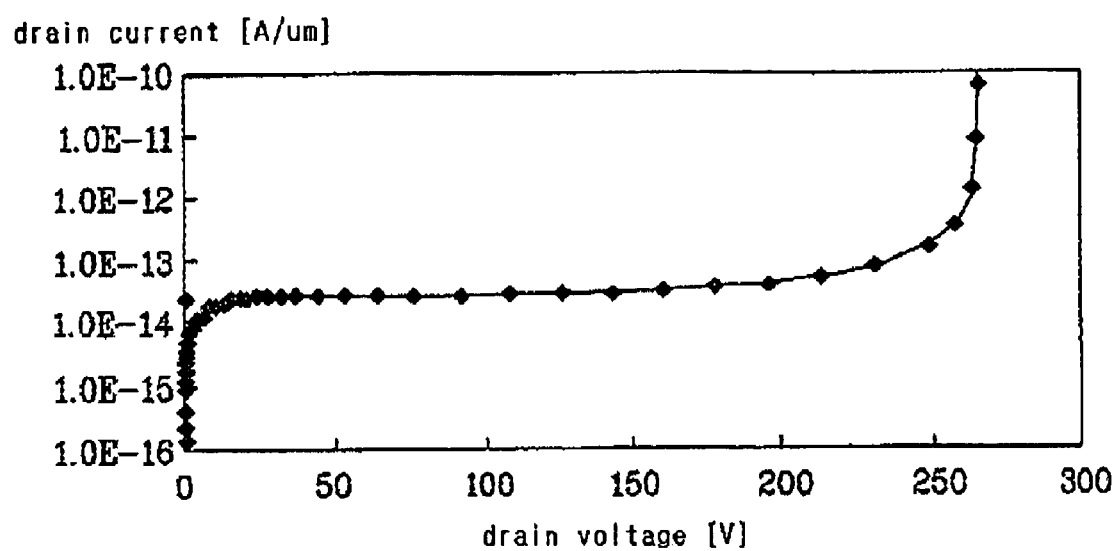
Figure 7:
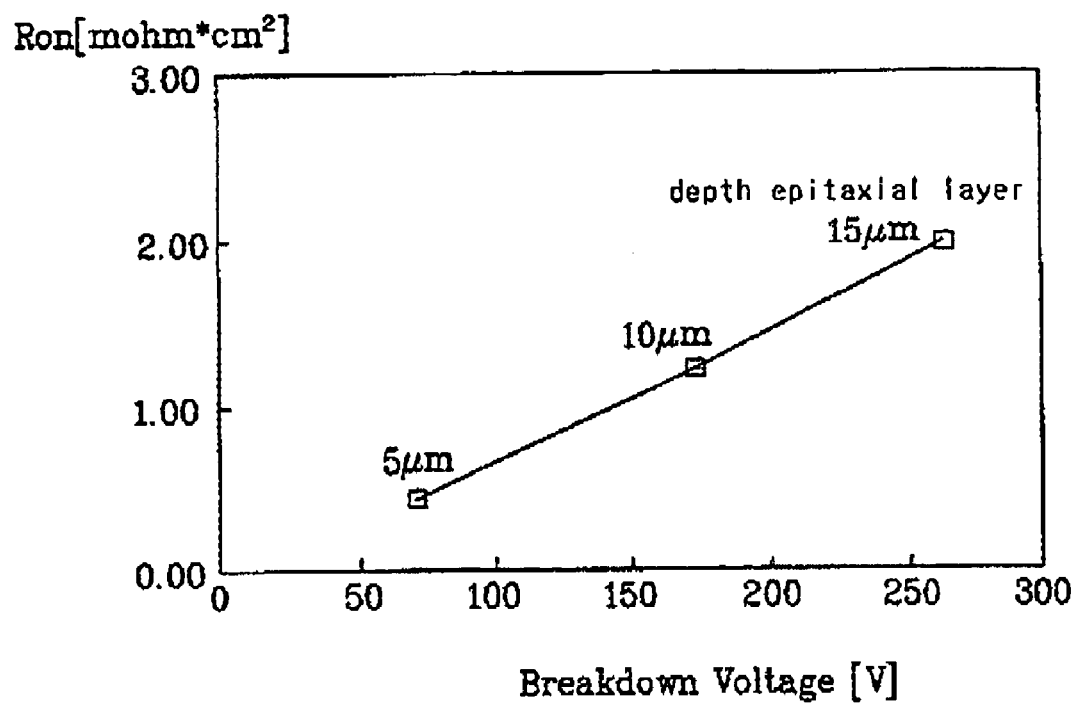
FIG. 7 is a data diagram illustrating a breakdown voltage and an ON resistance value (Ron) according to the depth of an epitaxial layer.

FIGS. 5 and 6 are data diagrams for illustrating a drain saturation current and breakdown characteristic according to a drain voltage, and FIG. 7 is a data diagram illustrating a breakdown voltage and ON resistance value (Ron) according to the depth of an epitaxial layer.

Before the explanation, it should be noted that the first conductive type is preferably P-type, and the second conductive type is preferably N-type.

First, as illustrated in FIG. 3, the semiconductor device according to a preferred embodiment of the present invention includes a second conductive type (N-type) epitaxial layer 42 on a first conductive type (P-type) substrate 41, trenches 44 (see FIG. 4B) formed at isolation regions of the substrate 41, and a first conductive type first region 46 in the epitaxial layer 42 at opposite sides of the trench 44, according to one preferred embodiment of the present invention. At this time, the trench 44 passes through the epitaxial layer 42 and exposes the substrate 41. That is, the trench 44 may have a deeper bottom portion than a PN junction 45 (see FIG. 4B) between the epitaxial layer 42 and the substrate 41.

Referring back to FIG. 3, an isolation layer 47a is formed in the trench 44. A gate insulation layer 48 is formed along upper side portions of the trench 44, and a gate electrode 49 is formed on the upper portion of the isolation layer 47a in the trench 44.

In addition, body regions 50 are formed within the active region between the trenches 44, a source electrode 52 is formed on each body region 50, and a source region 51 implanted with ions is formed on the upper portion of the body region 50 at both side portions of the gate electrode 49. The source electrode 52 is connected to the source region 51.

Further, at the rear surface of the substrate 41, a drain electrode 53 is formed.

In this manner, according to the semiconductor device of the present invention, a trench gate MOSFET is provided in which a gate electrode is formed at the upper inner portion of the trench, and two vertical channel regions are formed along side surfaces of one gate electrode 49. Therefore, the device can be highly integrated within a limited active region.

Figure 1:
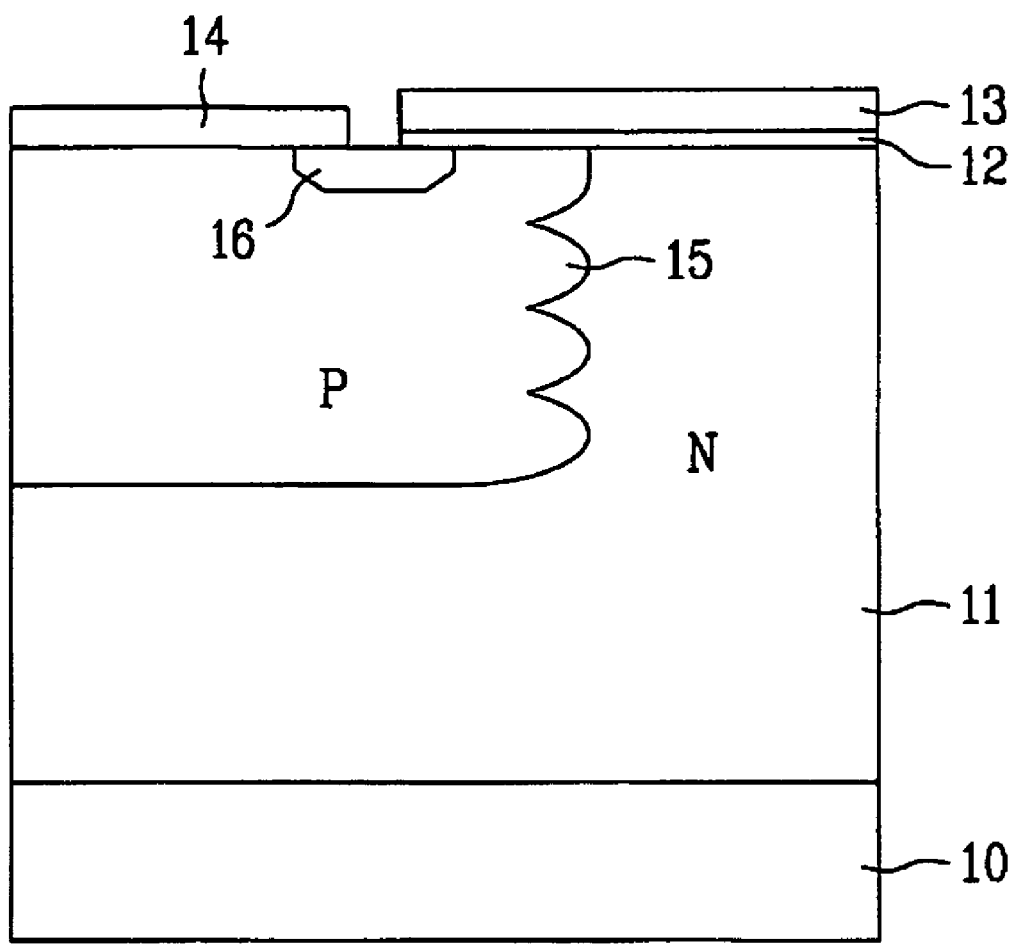
FIG. 1 is a cross-sectional view showing the structure of a conventional semiconductor device.
Figure 2:
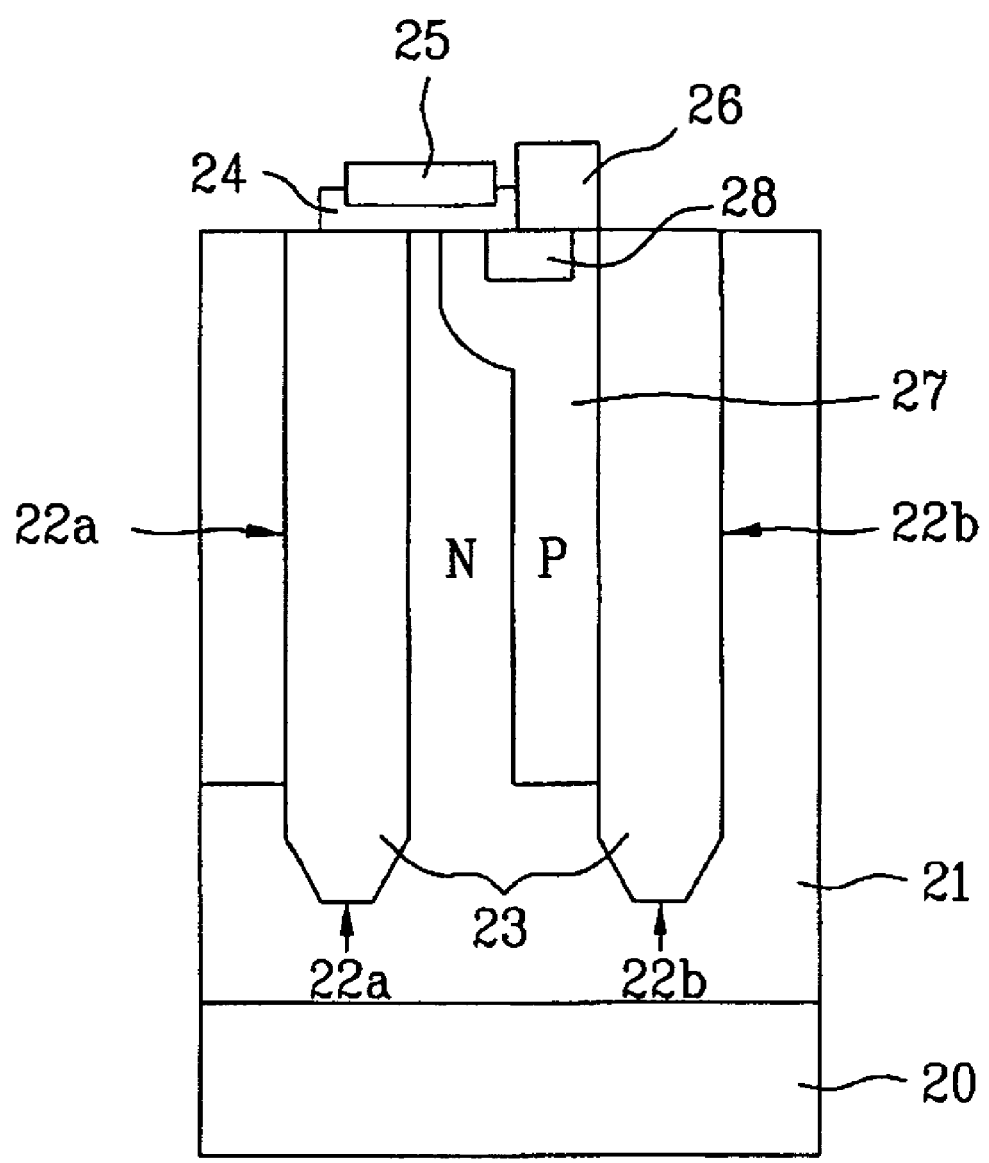
FIG. 2 is a cross-sectional view showing the structure of another conventional semiconductor device.
Figure 4A:
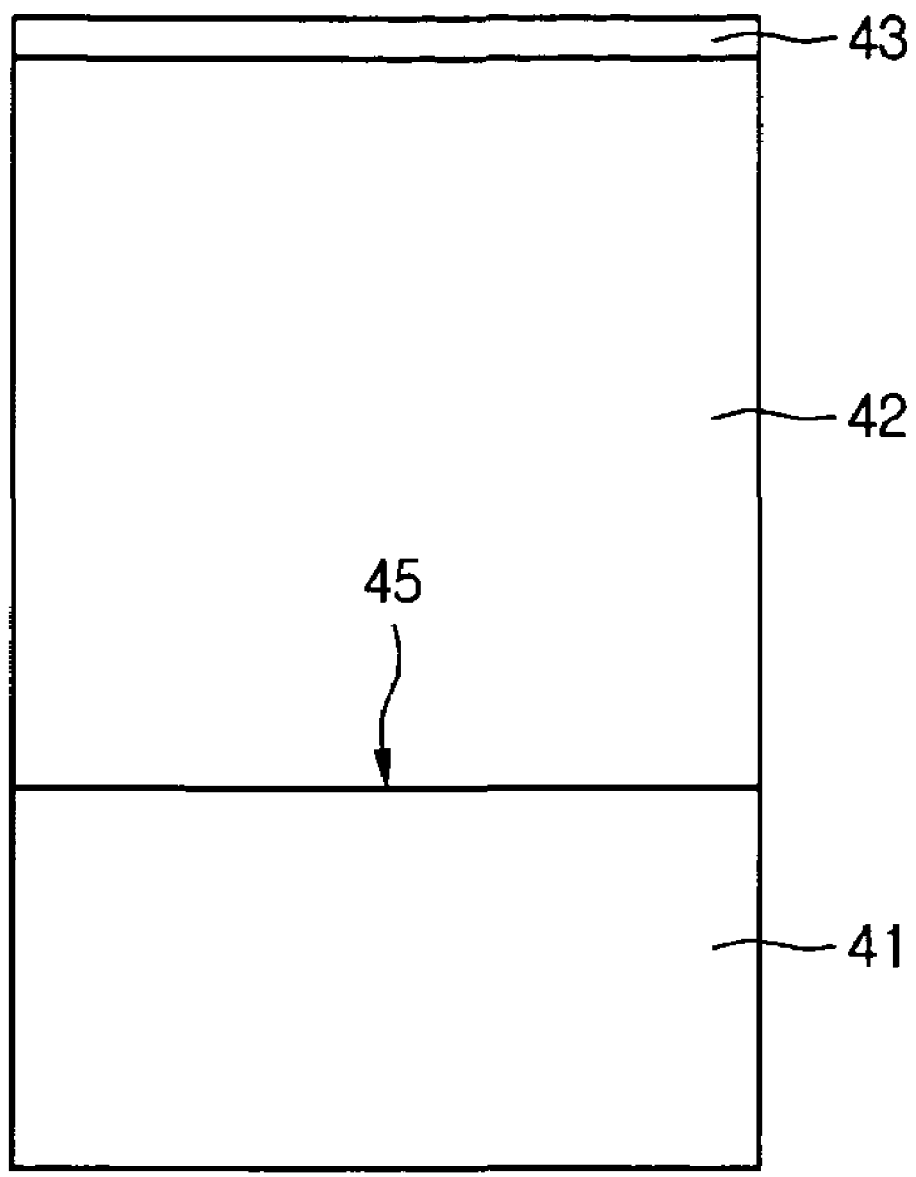
FIGS. 4A to 4I are cross-sectional views showing the procedure for manufacturing a semiconductor device according to a preferred embodiment of the present invention.

Hereinafter, the method of manufacturing the semiconductor device having the above-described construction according to the preferred embodiment of the present invention will be described. Referring to FIG. 4A, a second conductive type epitaxial layer 42 is grown on the first conductive type (P-type) substrate 41. Here, the epitaxial layer 42 represents a layer formed through an epitaxial growth.

In addition, in order to protect the surface of the substrate 41 on which the epitaxial layer 42 is grown, a pad insulation layer 43 is formed on the surface portion of the epitaxial layer 42. At this time, the insulation layer 43 comprises an oxide layer, formed by conventional deposition (e.g., CVD) or wet or dry thermal growth/oxidation.

Hereinafter, the P-type will be referred to as the first conductive type and the N-type will be referred to as the second conductive type. However, the complementary situation is also possible.

Figure 4B:
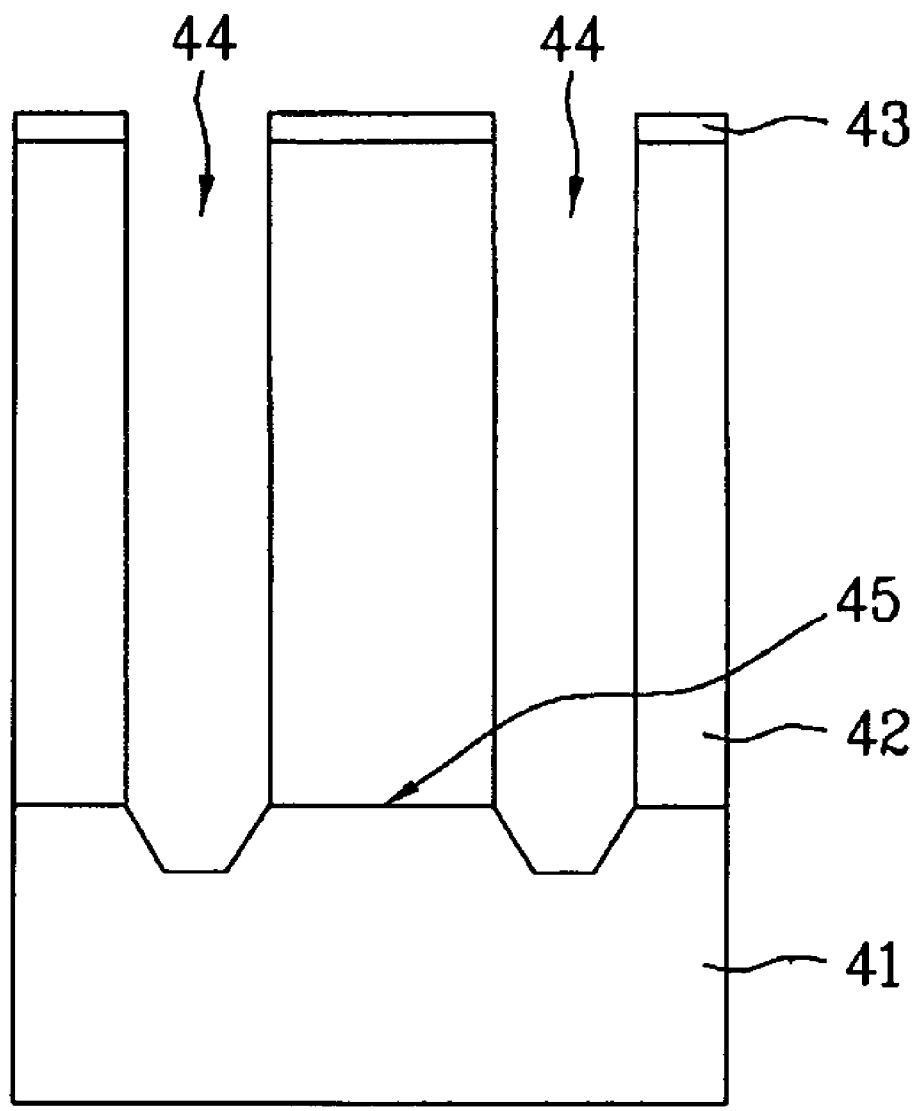

Referring to FIG. 4B, the first photoresist layer (not shown) is patterned using a photomask, and the epitaxial layer 42 is etched other than in the active region using the patterned first photoresist layer as a mask to form individual trenches 44 at each isolation region with a constant interval.

At this time, the depth of the trench 44 is set to be deeper than the PN junction 45 of the substrate 41 and of the epitaxial layer 41 grown on the substrate 41. That is, the trench 44 may expose the first conductive type (P-type) substrate 41, and/or have a depth of at least the thickness of the epitaxial layer 42.

Figure 4C:
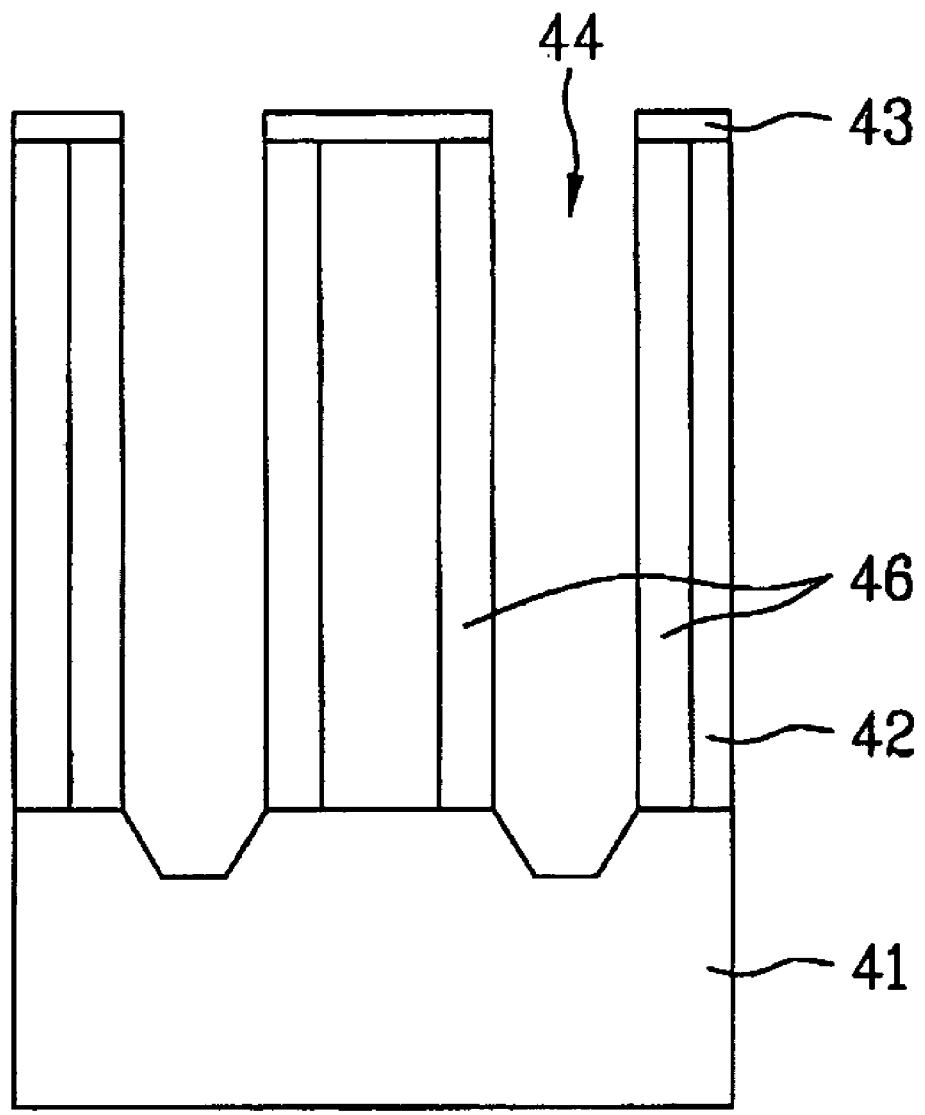

Next, referring to FIG. 4C, the first conductive type ions are tilt-implanted into the side portions of the trenches to form the first conductive type regions 46 at side portions of the active region. According to this process, a vertical PN junction can be formed by means of the second conductive type epitaxial layer 42 and the first conductive type region 46.

The insulation layer 43 includes an oxide layer that may be identical to the first insulation layer 47.

Figure 4D:
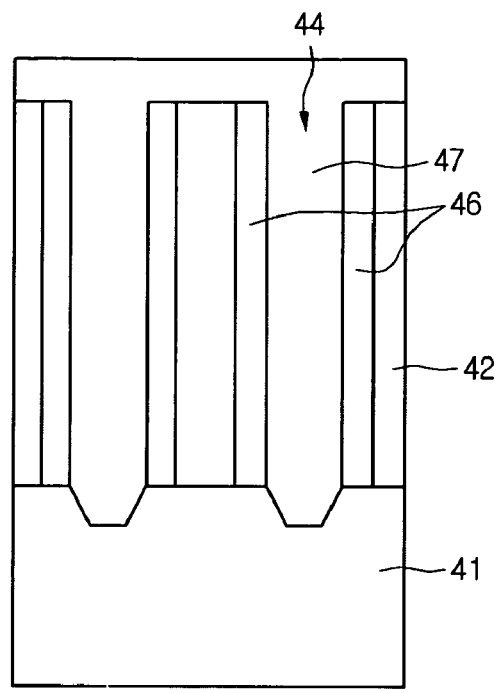

After that, referring to FIG. 4D, a first insulation layer 47 is deposited to fill the two trenches 44, preferably by CVD. At this time, the first insulation layer 47 includes an oxide layer, and may further include a liner oxide along sidewalls of the trench formed by conventional thermal oxidation.

Figure 4E:
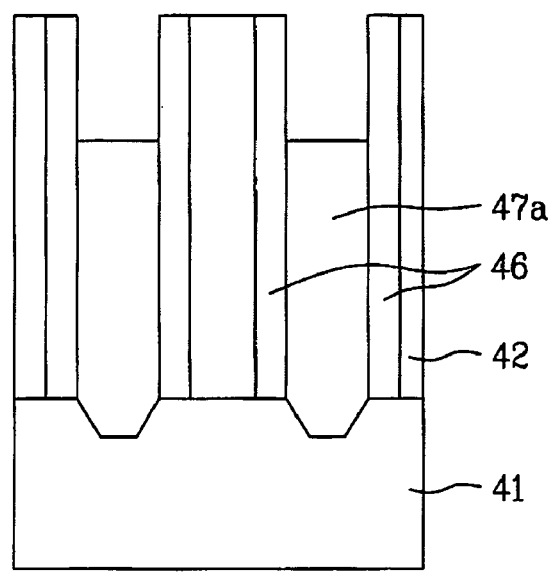

Then, referring to FIG. 4E, the first insulation layer 47 within the trench 44 is etched to a predetermined depth in order to expose a portion of the inner side of the trench 44 and/or retain a predetermined thickness (or target thickness range) of the first insulation layer 47. The process to expose the upper side portion of the trench 44 enables formation of the gate insulation layer and the gate electrode within the trench 44 later.

Figure 4F:
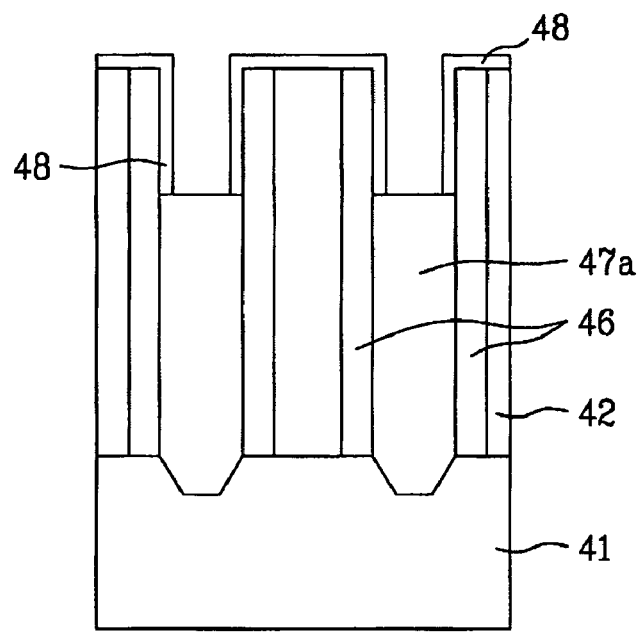

Referring to FIG. 4F, a gate insulation layer 48 is formed on the exposed upper side portions of the trench 44 through a thermal oxidation process.

Figure 4G:
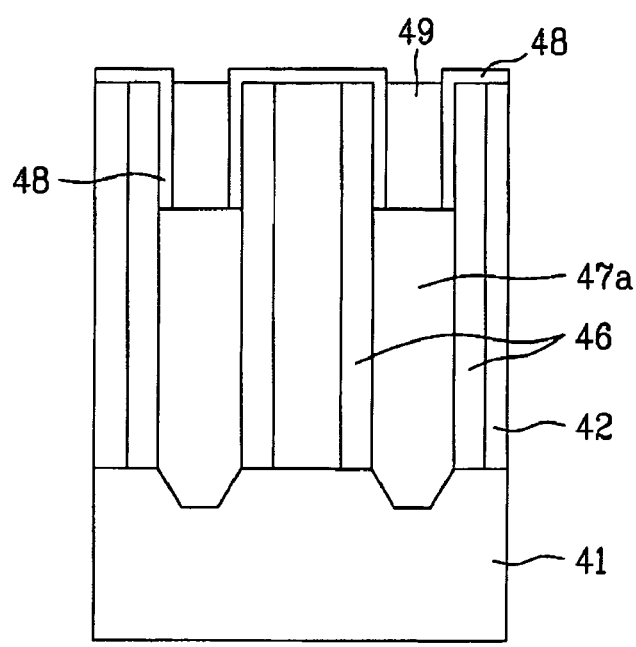

After that, referring to FIG. 4G, a polysilicon layer is deposited on the whole surface of the substrate, and a chemical mechanical polishing process is implemented to form a gate electrode 49 within the upper portion of each trench 44 and remove excess polysilicon from outside the trench 44.

Figure 4H:
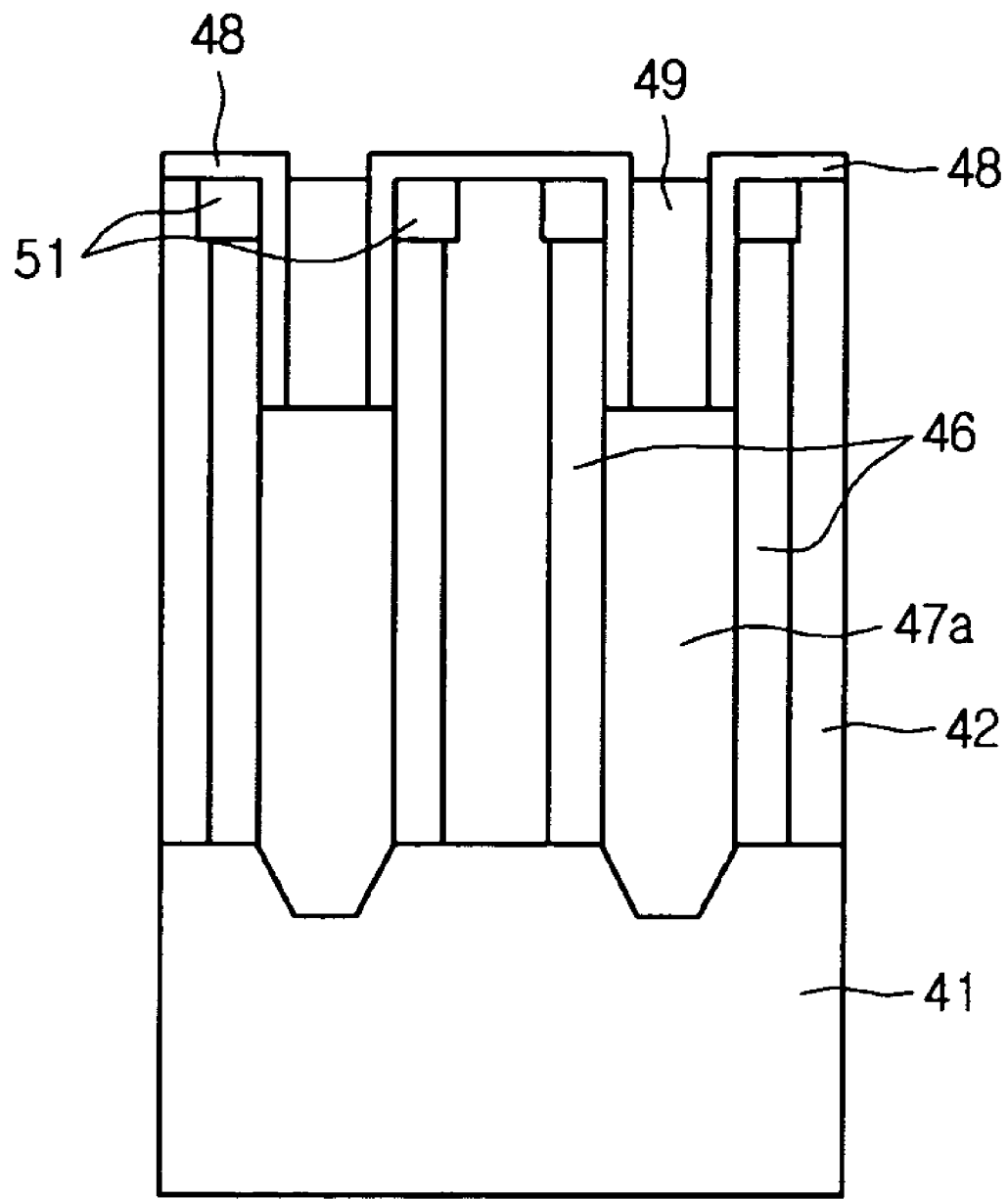

Next, as shown in FIG. 4H, source regions 51 are implanted into the epitaxial layer corresponding to the active regions on opposite sides of the gate electrode 49 to form source regions 51 at sides of the gate electrode 49.

The active region of the epitaxial layer corresponding to the depth of the gate electrode 49 may be called a body region 50.

Figure 4I:
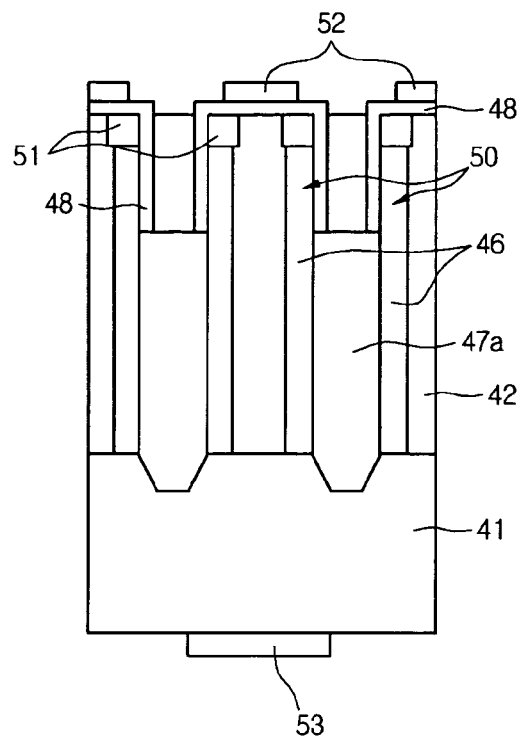

Next, as shown in FIG. 4I, a conductive material is deposited on the whole surface of the substrate 41 and a source electrode 52 is formed on the active region using a photomask, that is, on the body region 50 so that the source electrode 52 is connected to the source region 51 of the body region 50. The conductive material is also deposited on the rear surface of the substrate 41 to form a drain electrode 53.

Through the above-described processes, a trench gate MOSFET having a gate electrode within a trench is obtained and devices can be highly integrated on two active regions where channels are vertically formed along both sides of the gate electrode 49.

FIG. 5 shows drain saturation current of the semiconductor device according to the present invention, and FIG. 6 shows breakdown characteristics of the semiconductor device. As illustrated in FIGS. 5 and 6, the characteristics of the semiconductor device according to the present invention are improved or identical to those of the conventional semiconductor device.

Further, when the depth of the epitaxial layer, that is, the depth of the super-junction is 15 μm, 10 μm, and 5 μm, the breakdown voltage and the ON resistance of the device increase proportionally to the depth of the super-junction, as illustrated in FIG. 7. Therefore, the sufficient breakdown voltage of the device can be ensured by controlling the depth of the super-junction.

Although a preferred embodiment of the present invention has been described for illustrative purposes, those skilled in the art will appreciate that various modifications, additions and substitutions are possible, without departing from the scope and spirit of the invention as disclosed in the accompanying claims.

According to the semiconductor device and the method of manufacturing the same of the present invention, the following effects are obtainable.

First, the process for manufacturing the super-junction MOSFET is simplified when compared with the conventional method that requires several epitaxial layer growth and ion implantation processes.

Second, since two vertical channels are present along opposite sides of the gate electrode in the active region, the integration of the devices can be advantageously obtained while decreasing the ON resistance.

What is claimed is:

1. A method of forming a semiconductor device, the method comprising the steps of:
    forming an epitaxial layer having a second conductivity type on a first conductive type substrate;
    forming a trench in the epitaxial layer;
    forming a P-N junction along an inner wall of the trench;
    depositing an insulation layer in the trench such that the trench is filled with the insulation layer;
    etching the insulation layer such that an upper side section of the trench is exposed;
    forming a gate electrode on the insulation layer;
    forming a source region at opposite sides of the gate electrode; and
    forming source and drain electrodes.

2. The method as claimed in claim 1, wherein the step of forming the P-N junction includes forming a first conductive type layer on an inner wall of the trench.

3. The method as claimed in claim 1, wherein the step of depositing the insulation layer in the trench includes the substeps of:
    forming an isolation layer filling the trench to a predetermined height; and
    forming a gate insulation layer on the isolation layer.

4. The method as claimed in claim 1, wherein the step of forming the on P-N junction along the inner wall of the trench includes a step of implanting first conductive type ions.

5. The method as claimed in claim 1, wherein the first conductive type is a P-type and the second conductive type is an N-type.

6. The method as claimed in claim 1, wherein the trench has a depth reaching the first conductive type substrate.

7. The method as claimed in claim 1, wherein the step of forming the trench in the epitaxial layer includes a step of forming a pad insulation layer on the epitaxial layer to protect a surface of the epitaxial layer.

8. The method as claimed in claim 1, wherein the step of depositing the insulation layer in the trench includes forming an isolation layer having a predetermined height in the trench and on or over uppermost surfaces of the epitaxial layer and the first conductive type layer.

9. The method as claimed in claim 8, wherein the method further includes, after etching the insulating layer, forming a gate insulation layer on the isolation layer in the trench and on or over uppermost surfaces of the epitaxial layer and the first conductive type layer.

10. The method as claimed in claim 1, wherein the trench has a depth of at least a thickness of the epitaxial layer.

11. The method as claimed in claim 1, wherein the trench has a deeper bottom portion than the P-N junction, the P-N junction between the epitaxial layer and the substrate.

12. The method as claimed in claim 1, wherein the gate insulation layer is formed along upper side portions of the trench.

13. The method as claimed in claim 1, wherein the gate electrode is formed on an uppermost surface of the isolation layer in the trench.

14. The method as claimed in claim 1, further comprising forming vertical channel regions on side surfaces of the gate electrode.

15. The method as claimed in claim 1, further comprising forming body regions within active regions between neighboring trenches.

16. The method as claimed in claim 1, further comprising forming the source region on an upper portion of body regions at side portions of the gate electrode.

17. The method as claimed in claim 1, further comprising forming the drain electrode at a rear surface of the substrate.

18. The method as claimed in claim 1, wherein the insulation layer comprises an oxide layer.

19. The method as claimed in claim 18, wherein the oxide layer is formed by chemical vapor deposition.

20. The method as claimed in claim 18, wherein the oxide layer is formed by wet or dry thermal growth/oxidation.

* * * * *